United States Patent
Cho et al.

(10) Patent No.: US 7,265,061 B1
(45) Date of Patent: Sep. 4, 2007

(54) METHOD AND APPARATUS FOR UV EXPOSURE OF LOW DIELECTRIC CONSTANT MATERIALS FOR POROGEN REMOVAL AND IMPROVED MECHANICAL PROPERTIES

(75) Inventors: Seon-Mee Cho, Beaverton, OR (US); Easwar Srinivasan, Beaverton, OR (US); Brian G. Lu, Fremont, CA (US); David Mordo, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/800,377

(22) Filed: Mar. 11, 2004

Related U.S. Application Data

(63) Continuation-in-part of application No. 10/672,311, filed on Sep. 26, 2003.

(51) Int. Cl.
*H01L 21/31* (2006.01)

(52) U.S. Cl. .................................. 438/764; 438/781

(58) Field of Classification Search ............. 438/758, 438/764, 778, 780, 781, 783, 784, 787, 790, 438/791, 794, 788, 792
See application file for complete search history.

(56) References Cited

U.S. PATENT DOCUMENTS

| | | | |
|---|---|---|---|
| 4,357,451 A | 11/1982 | McDaniel | |
| 4,882,008 A | 11/1989 | Garza et al. | |
| 4,885,262 A | 12/1989 | Ting et al. | |
| 5,504,042 A | 4/1996 | Cho et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,849,640 A | 12/1998 | Hsia et al. | |
| 5,851,715 A | 12/1998 | Barthel et al. | |
| 5,858,457 A | 1/1999 | Brinker et al. | |
| 5,920,790 A | 7/1999 | Wetzel et al. | |
| 6,140,252 A | 10/2000 | Cho et al. | |
| 6,171,661 B1 | 1/2001 | Zheng et al. | |
| 6,177,329 B1 | 1/2001 | Pang | |
| 6,232,658 B1 | 5/2001 | Catabay et al. | |
| 6,258,735 B1 | 7/2001 | Xia et al. | |

(Continued)

FOREIGN PATENT DOCUMENTS

WO   WO95/07543   3/1995

OTHER PUBLICATIONS

U.S. Office Action mailed Jul. 13, 2005, from U.S. Appl. No. 10/672,311.

(Continued)

*Primary Examiner*—Kevin M. Picardat
(74) *Attorney, Agent, or Firm*—Beyer Weaver LLP

(57) ABSTRACT

Methods and apparatus for preparing a porous low-k dielectric material on a substrate are provided. The methods optionally involve the use of ultraviolet radiation to react with and remove porogen from a porogen containing precursor film leaving a porous dielectric matrix and further exposing the dielectric matrix to ultraviolet radiation to increase the mechanical strength of the dielectric matrix. Some methods involve activating a gas to create reactive gas species that can clean a reaction chamber. One disclosed apparatus includes an array of multiple ultraviolet sources that can be controlled such that different wavelengths of light can be used to irradiate a sample at a time.

38 Claims, 5 Drawing Sheets

U.S. PATENT DOCUMENTS

| | | |
|---|---|---|
| 6,268,276 B1 | 7/2001 | Chan et al. |
| 6,270,846 B1 | 8/2001 | Brinker et al. |
| 6,271,273 B1 | 8/2001 | You et al. |
| 6,312,793 B1 | 11/2001 | Grill et al. |
| 6,329,017 B1 | 12/2001 | Liu et al. |
| 6,329,062 B1 | 12/2001 | Gaynor |
| 6,340,628 B1 | 1/2002 | Van Cleemput et al. |
| 6,365,266 B1 | 4/2002 | MacDougall et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,420,441 B1 | 7/2002 | Allen et al. |
| 6,444,715 B1 * | 9/2002 | Mukherjee et al. .. 257/E21.273 |
| 6,455,417 B1 | 9/2002 | Bao et al. |
| 6,479,374 B1 | 11/2002 | Ioka et al. |
| 6,500,770 B1 | 12/2002 | Cheng et al. |
| 6,548,113 B1 | 4/2003 | Birnbaum et al. |
| 6,573,030 B1 | 6/2003 | Fairbairn et al. |
| 6,576,345 B1 | 6/2003 | Cleemput et al. |
| 6,596,467 B2 | 7/2003 | Gallagher et al. |
| 6,596,654 B1 | 7/2003 | Bayman et al. |
| 6,610,362 B1 | 8/2003 | Towle |
| 6,632,478 B2 | 10/2003 | Gaillard et al. |
| 6,667,147 B2 | 12/2003 | Gallagher et al. |
| 6,677,251 B1 | 1/2004 | Lu et al. |
| 6,715,498 B1 | 4/2004 | Humayun et al. |
| 6,756,085 B2 | 6/2004 | Waldfried et al. |
| 6,797,643 B2 | 9/2004 | Rocha-Alvarez et al. |
| 6,805,801 B1 | 10/2004 | Humayun et al. |
| 6,812,043 B2 | 11/2004 | Bao et al. |
| 6,815,373 B2 | 11/2004 | Singh et al. |
| 6,831,284 B2 | 12/2004 | Demos et al. |
| 6,846,380 B2 | 1/2005 | Dickinson et al. |
| 6,848,458 B1 | 2/2005 | Shrinivasan et al. |
| 6,849,549 B1 | 2/2005 | Chiou et al. |
| 6,867,086 B1 | 3/2005 | Chen et al. |
| 6,903,004 B1 | 6/2005 | Spencer et al. |
| 6,914,014 B2 | 7/2005 | Li et al. |
| 7,018,918 B2 | 3/2006 | Kloster et al. |
| 2002/0001973 A1 | 1/2002 | Wu et al. |
| 2002/0016085 A1 | 2/2002 | Huang et al. |
| 2002/0034626 A1 | 3/2002 | Liu et al. |
| 2002/0106500 A1 | 8/2002 | Albano et al. |
| 2002/0123240 A1 | 9/2002 | Gallagher et al. |
| 2002/0192980 A1 | 12/2002 | Hogle et al. |
| 2003/0064607 A1 | 4/2003 | Leu et al. |
| 2003/0119307 A1 | 6/2003 | Bekiaris et al. |
| 2003/0157248 A1 | 8/2003 | Watkins et al. |
| 2003/0198895 A1 | 10/2003 | Toma et al. |
| 2004/0069410 A1 | 4/2004 | Moghadam et al. |
| 2004/0096586 A1 | 5/2004 | Schulberg et al. |
| 2004/0096593 A1 | 5/2004 | Lukas et al. |
| 2004/0096672 A1 * | 5/2004 | Lukas et al. ................ 427/243 |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0161532 A1 | 8/2004 | Kloster et al. |
| 2004/0170760 A1 | 9/2004 | Meagley et al. |
| 2004/0185679 A1 | 9/2004 | Ott et al. |
| 2005/0064698 A1 | 3/2005 | Chang et al. |

OTHER PUBLICATIONS

U.S. Office Action Mailed Jul. 27, 2005, from U.S. Appl. No. 10/785,235.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

U.S. Office Action mailed Jan. 9, 2006, from U.S. Appl. No. 10/785,235.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

Jan, C.H. et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods For Producing Low-K CDO Films With Low Residual Stress.

Wu et al., U.S. Appl. No. 10/820,525, entitled: Methods For Producing Low-K CDO Films With Low Residual Stress.

Wu et al., U.S. Appl. No. 10/800,409, entitled: Methods For Producing Low-K CDO Films.

U.S. Appl. No. 10/016,017, File Date: Dec. 12, 2001.

U.S. Appl. No. 10/125,614, File Date: Apr. 18, 2002.

U.S. Appl. No. 10/202,987, File Date: Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Humayun et al., "Methods For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, Office Action dated Mar. 22, 2005.

R.D. Miller et al., "Phase-Seperated Inorganic-Organic Hybrids for Microelectronic Applications," MRS Bulletin, Oct. 1997, pp. 44-48.

Jin et al., "Nanoporous Silica as an Ultralow-*k* Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac, Sci. Technol. B 19(2), Mar./Apr. 2001, pp. 569-572.

Asoh et al., "Conditions for Fabrication of Ideally Ordered Anodic Porous Alumina Using Pretextured Al," Journal of the Electrochemica Society, 148 (4) B152-156 (2001) pp. B152-B156.

Holland et al., "Nonlithographic Techinique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," Appl. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufaturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials", U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

Humayun et al., "Method For Forming Porous Films By Porogen Removal Combined With In Situ Surface Modification", U.S. Appl. No. 10/404,693, filed Mar. 31, 2003.

Bandyopadhyay et al., "Method to Improve Machanical Strength of Low-K Dielectric Film Using Modulated UV Exposure", U.S. Appl. No. 10/825,888, filed Apr. 16, 2004.

Wu et al., "Methods Of Porogen Removal For Porous Low Dielectric Constant Films Using Plasma Treatments", U.S. Appl. No. 10/807,680, filed Mar. 23, 2004.

Tipton et al., "Method Of Porogen Removal From Porous Low-K Films Using Uv Radiation", U.S. Appl. No. 10/672,311, filed Sep. 26, 2003.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Gangpadhyay et al., "The First International Surface Cleaning Workshop," Northeastern University, Nov. 11-14, 2002.

Justin F. Gaynor, "In-Situ Treatment of Low-K Films With a Silylating Agent After Exposure To Oxidizing Environments," U.S. Appl. No. 10/056,926 filed Jan. 24, 2002, 34 Pages.

Tipton et al., "Method For Removal Of Porogens From Porous Low-K Films Using Supercritical Fluids", U.S. Appl. No. 10/672,305, filed Sep. 26, 2003, Office Action dated Sep. 1, 2005.

Humayun et al., "Method For Forming Porous Films By Porogen Removal Combined With In Situ Modification", U.S. Appl. No. 10/404,693, filed Mar. 31, 2003, Office Action dated Aug. 24, 2005.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed May 2, 2006, from U.S. Appl. No. 10/295,965.

U.S. Office Action mailed Aug. 9, 2005, from U.S. Appl. No. 10/295,965.

* cited by examiner

METHOD AND APPARATUS FOR UV EXPOSURE OF LOW DIELECTRIC CONSTANT MATERIALS FOR POROGEN REMOVAL AND IMPROVED MECHANICAL PROPERTIES

CROSS-REFERENCE TO RELATED APPLICATIONS

This application is a continuation-in-part claiming priority under 35 USC 120 from U.S. patent application Ser. No. 10/672,311, filed on Sep. 26, 2003, titled "Method of Porogen Removal from Porous Low-k Films Using UV Radiation," by Adrianne Tipton et al., which application is incorporated herein by reference in its entirety for all purposes, and which in turn claims priority under 35 USC 119(e) from U.S. Provisional Application No. 60/469,433, filed on May 9, 2003, also titled "Method of Porogen Removal from Porous Low-k Films Using UV Radiation." This application is also related to U.S. patent application Ser. No. 10/404,693, filed on Mar. 31, 2003, titled "Method for Forming Porous Films by Porogen Removal Combined with In Situ Surface Modification," by Raashina Humayun et al.; U.S. patent application Ser. No. 10/672,305, filed on Sep. 26, 2003, titled "Method for Removal of Porogens from Porous Low-k Films Using Supercritical Fluids," by Adrianne Tipton et al.; and to U.S. patent application Ser. No. 10/295,965 filed Nov. 15, 2002 by Schulberg, et al., and titled "System for Deposition of Mesoporous Materials," which applications are incorporated herein by reference in its entirety for all purposes.

FIELD OF THE INVENTION

This invention relates to methods and apparatus for preparing porous low-k dielectric films for integrated circuits. More specifically, the invention employs ultraviolet radiation to (a) remove porogen material from a precursor dielectric film, (b) improve the mechanical strength of dielectric film, and/or (c) remove porogen material and/or other residual deposition materials from the reaction chamber.

BACKGROUND

There is a general need for materials with low dielectric constants (low-k) in the integrated circuit manufacturing industry. Using low-k materials as the inter-metal and/or inter-layer dielectric between conductive interconnects reduces the delay in signal propagation due to capacitive effects. The lower the dielectric constant of the dielectric, the lower the capacitance of the dielectric and the lower the RC delay of the integrated circuit (IC).

Low k dielectrics are conventionally defined as those materials that have a dielectric constant lower than that of silicon dioxide—that is k<4. Typical methods of obtaining low-k materials include doping silicon dioxide with various functional groups containing carbon or fluorine. While fluorinated silicate glass (FSG) generally has k of 3.5–3.9, carbon-doping methods can further lower the k value to ~2.5. Current efforts are focused on developing low-k dielectric materials with k values less than 2.5 for the most advanced technology needs. These ultra low-k (ULK) dielectrics can be obtained by incorporating air voids within a low-k dielectric matrix, creating a porous dielectric material.

Methods of fabricating porous dielectrics typically involve forming a film (sometimes referred to herein as a "precursor film") containing two components: a porogen (typically an organic material such as a hydrocarbon) and a structure former or dielectric material (e.g., a silicon containing material). Once the precursor film is formed on the substrate, the porogen component can be removed, leaving a structurally intact porous dielectric matrix. Techniques for removing porogens from the precursor film include, for example, a thermal process in which the substrate is heated to a temperature sufficient for the breakdown and vaporization of the organic porogen. These thermal processes, however, have certain drawbacks. In particular, substrate temperatures generally need to be high (i.e. greater than about 400 degrees Celsius) with exposure times typically on the order of hours. As is well known in the field, these conditions are unacceptable for backend-of-line applications as they can damage copper-containing devices. To overcome these difficulties, U.S. patent application Ser. No. 10/672,311, by Tipton et al. (which application is incorporated herein by reference in its entirety for all purposes) discloses methods for removing porogen material from a precursor film using UV radiation.

Although the general approach of introducing voids into the dielectric will reduce the dielectric constant of the film, it will also reduce the density of the film and may sacrifice the mechanical strength and the thermo-mechanical properties of the film. Since dielectric films can be subjected to severe thermal and mechanical stresses in IC processes such as chemical mechanical polishing (CMP) and packaging, these porous films must have sufficient mechanical strength to withstand these processes. Therefore, improved methods of forming mechanically robust low-k porous films are needed.

In addition, after a UV porogen removal process, such as described in U.S. patent application Ser. No. 10/672,311, the UV reaction chamber can become coated with porogen residues, including the windows that allow UV light to reach the wafer. With time, the porogen residue can reduce the effectiveness of the subsequent UV porogen removal processes. Furthermore, the build-up of excessive residues in the chamber can be a source of particulate defects. Thus, methods and apparatus to adequately clean reaction chambers after an UV porogen removal process in a production environment are also needed.

SUMMARY

The present invention addresses this need by providing improved methods and apparatus for preparing a low-k dielectric material on a substrate using UV radiation. In some embodiments, methods also include a further cleaning of the UV reaction chamber between UV exposures. In particular, methods involve (a) forming a precursor film that contains a porogen and a structure former on a substrate, (b) removing the porogen from the precursor film to thereby create voids within the dielectric material and form the porous low-k dielectric layer and (c) exposing the dielectric material to ultra-violet radiation (UV) in a manner that increases the mechanical strength of the porous low-k dielectric layer. In other embodiments, an additional operation is performed which involves (d) activating a gas by exposure to ultraviolet radiation to produce a species that cleans porogen residue from surfaces within the reaction chamber.

In preferred embodiments, the substrate is a semiconductor wafer. Methods of the invention may be performed in a single-wafer process or batch process. The precursor film is preferably formed by co-depositing the porogen with the structure former. Preferably, the porogen is an organic material and the structure former is a silicon-containing material. In preferred embodiments, the structure former is produced from a silane, an alkylsilane, an alkoxysilane, a siloxane (particularly the carbon-containing varieties), and combinations thereof. Examples of suitable siloxanes include octamethyl cyclotetrasiloxane (OMCTS), tetramethylcyclotetrasiloxane (TMCTS), dimethyldimethoxysilane (DMDMOS), and diethoxymethylsilane (DEMS). These and other carbon containing compounds can be used to form carbon-doped oxides (CDOs).

One preferred class of porogen compounds is the polyfunctional cyclic non-aromatic compounds. Good examples of such compounds are the alpha-terpiene (ATRP) compounds. Another class of porogen is the template forming compounds such as certain block copolymer materials, such as polyethylene oxide (PEO)-polypropylene oxide (PPO) block copolymers, used to form ordered mesoporous films. Examples of these types of compounds are various organic silanes, such as di-tert-butyl-silane, that possess bulky organic groups. All of the above porogen compounds can be driven from the deposited silicon-oxygen matrix to leave behind small pores.

The precursor film can be formed using a CVD process (e.g., a plasma enhanced chemical vapor deposition (PECVD) technique), a spin-on process, or another condensed phase method.

UV wavelengths, exposure time and intensity required for porogen removal and mechanical strengthening depend on a number of factors, including the thickness of the dielectric film, the composition of the dielectric, and, to the extent that UV is used to remove porogen, the type of porogen used. Substrate temperatures can vary broadly during the UV exposure and may range between about minus 10 degree Celsius and 600 degrees Celsius, preferably below 400 degrees Celsius.

In preferred embodiments, removing porogen from the precursor film, (b), involves using UV radiation that has wavelengths at or near an absorption peak of the porogen. For many porogens, appropriate wavelengths range between about 156 to about 800 nm. Preferred exposure times to remove porogen range between about 1 second and 60 minutes depending on UV intensity. Substrate temperatures typically range between about −10 and 600 degrees Celsius, preferably below 400 degrees Celsius.

Exposing the porous dielectric to UV radiation to increase the mechanical strength of the film, (c), preferably takes place in an inert environment (such as ambient comprising argon, nitrogen, helium, or a combination thereof). In some embodiments, other gases, such as hydrogen, oxygen and/or carbon dioxide, may be present. In some embodiments, portions of operations (b) and (c) occur simultaneously. Preferable wavelengths range between about 156 and 800 nm. UV radiation intensity typically ranges between about 1 $\mu W/cm^2$ and 3000 $mW/cm^2$ for most films. UV exposure times can vary but preferable exposure times range between about 1 second and 60 minutes. Substrate temperatures preferably range between about −10 and 600 degrees Celsius, preferably below 400 degrees Celsius. During UV exposure, the pressure in the chamber is maintained preferably between about 1 μTorr and 760 Torr. The resultant porous low-k dielectric layer will preferably have a hardness value of at least about 0.5 GPa. In some embodiments of the invention, the precursor film deposition and UV exposure may be repeatedly performed to form a film with desired material properties.

Operation (d) involves exposing a gas using UV radiation to produce a reactive gas. The gas is preferably oxygen and the reactive gas preferably comprises at least one of ozone and/or active oxygen radicals. The gas may also comprise of a halogen containing gas such as a fluorine containing gas. Preferred wavelengths range from about 150 to about 400 nm, preferred light intensities range between about 1 $\mu W/cm^2$ and about 3000 $mW/cm^2$, and preferred exposure times range between about 1 second and 60 minutes.

An apparatus suitable for producing the low-k dielectric is also described. The apparatus comprises (a) a support for holding a partially fabricated integrated circuit, and (b) a plurality of UV sources wherein individual ones of the plurality of UV sources provide different wavelength distributions of UV radiation. Each of the UV sources can provide UV light for at least one of the following operations: (i) removing porogen from precursor dielectric film, (ii) reconstructing chemical bonds in the dielectric layer to improve mechanical strength, and (iii) cleaning porogen residue from the apparatus.

The apparatus preferably has at least two UV sources. In some embodiments, the apparatus further comprises a control system for illuminating one or more of the UV sources. In some embodiments, the UV sources are movable with respect to the substrate support during operation. The plurality of UV sources may be one or more of a mercury lamp, a deuterium lamp, a xenon lamp, and an Excimer laser.

These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF A PREFERRED EMBODIMENT

Introduction

Figure 1:
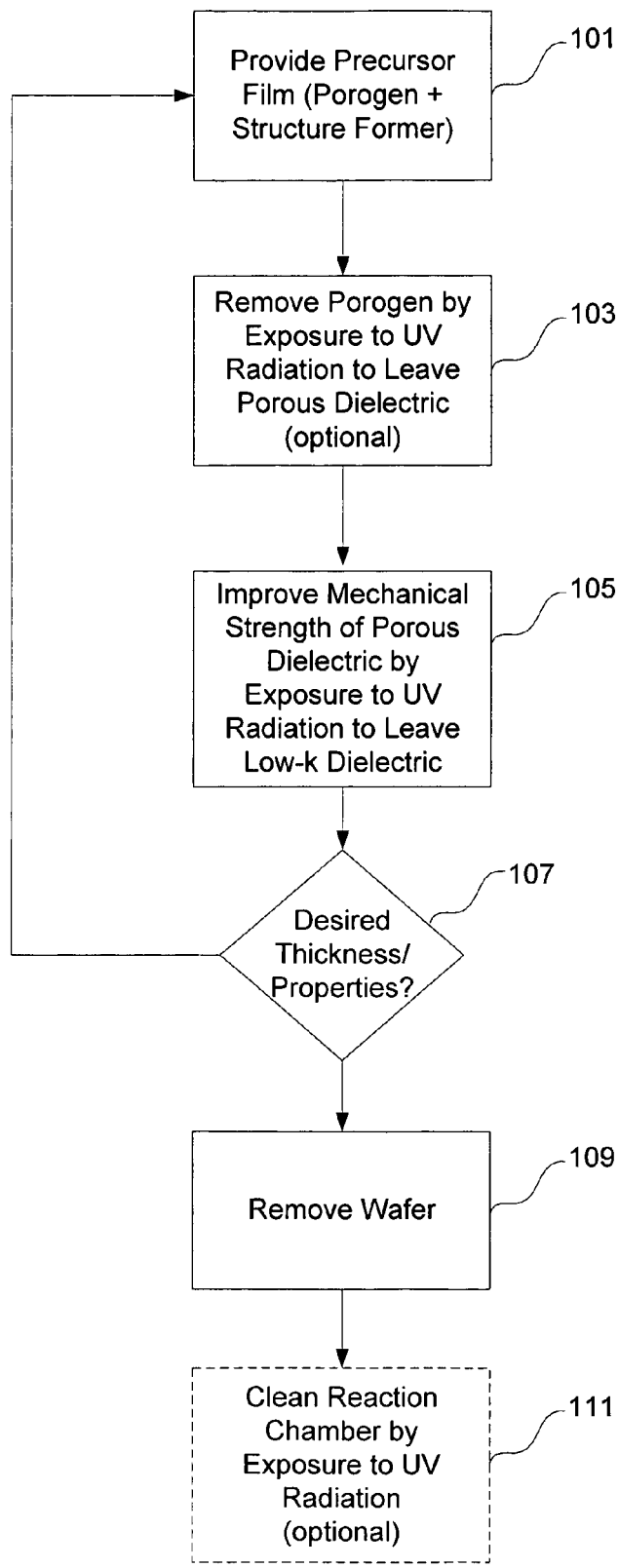
FIG. 1 is a flowchart summarizing stages of example implementations of the invention.

In the following description, numerous specific details are set forth in order to provide a thorough understanding of the present invention, which pertains to porogen removal of a porous precursor film. The porous precursor film may be a carbon-doped oxide (CDO). The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves forming a low-k dielectric material by way of a "precursor film" or "precursor layer" that contains a "structure former," typically a dielectric material, which serves as a backbone of the porous network, and a porogen, which generates the porous regions within the dielectric film. Hence, the porogen and dielectric matrix typically exist as separate phases within the precursor layer. In methods of this invention, the porogen is removed from the precursor film to create a porous low-k dielectric layer. Within the precursor film, the porogen resides in locations that will subsequently become void locations in the final dielectric film.

Methods of the invention also involve increasing the "mechanical strength" of the porous low-k dielectric layer. Mechanical strength may be manifest in terms of hardness, modulus, intrinsic stress, cohesive strength, etc. Intrinsic stress, hardness and modulus are well defined within the art and will not be discussed in detail herein. Measures of film hardness presented herein may be made with any suitable apparatus including a nano-indenter device. Measure of intrinsic film stress may be made with any suitable apparatus including a stress gauge.

One way to characterize cohesive strength in a dielectric layer is via a "cracking threshold" measurement. This is a measure of thickness of a dielectric film on a blank substrate (e.g., a flat 200 or 300 mm wafer) that can be deposited without forming a crack. In a typical experiment, the dielectric is deposited to various thicknesses using a single set of process conditions. The resulting wafer (with dielectric layer) is set aside without disturbance for a period of time (e.g., one day) and then examined for cracks. The greatest thickness at which no crack is observed is the cracking threshold. For many processes, the cracking threshold is measured in micrometers.

The precursor film may be formed by any of numerous techniques. In some methods, the structure former and porogen are co-deposited in one process. Any suitable deposition technique may be used, including spin-coating processes, print-on, dip coating, thermal process and chemical vapor deposition—particularly plasma enhanced chemical vapor deposition (PECVD). In alternative methods, the structure former and porogen are deposited separately in a two-phase process. For example, in some mesoporous films, a template-forming precursor, solvent and catalyst are mixed and applied by spin-coat or print-on methods to form a template in a first process phase, then a silica-forming precursor is introduced to the formed template in a second process step such as supercritical infusion into a polymer matrix. Depending on the application, the thickness of the precursor film may range between about 30 nanometers and 3 micrometers.

Generally, a porogen is any removable material that defines void regions in a dielectric matrix. Frequently, though not necessarily, the porogen is an organic material. In methods of the present invention, the porogen is removed from the precursor film by a UV mediated method. In a first approach, the UV light directly interacts with the porogen to chemically decompose or otherwise modify the porogen and produce products that are more easily removed than the porogen itself. In another approach, the UV exposure occurs in the presence of oxygen to create an oxidizing environment (e.g., ozone and/or oxygen radicals) that oxidizes the porogen. The oxidation products are more easily removed than the porogen itself. Note that in this approach, some UV radiation may interact directly with the porogen as well. In general, the UV radiation is tuned for absorption by the porogen in the first approach and tuned for oxygen activation in the second approach. Thus, in the first approach, the UV radiation preferably has a high intensity component at a wavelength (or range of wavelengths) at or near an absorption peak of the porogen. Of course, the porogen may be chosen to match the characteristics of an available UV source.

In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

Frequently, the porogen is a hydrocarbon. The following is a non-comprehensive list of precursor films (listed by type of porogen molecules) suitable for the present invention. "Low temperature porogens" are deposited below about 200 degrees C. and "high temperature porogens" are deposited above about 200 degree C.

| Low Temperature Porogens | High Temperature Porogens |
| --- | --- |
| Aldehydes: CH2O, CH3CHO | Alkenes: C2H4, CH3—CH=CH2, etc |
| Alkenes: C2H4, CH3—CH=CH2, etc | Terpiene family compounds (e.g. alpha-terpiene) |
| di-tert-butyl silane | Terpiene derivatives (such as terpinol) |
| Esters | Compounds with multiple active sites (e.g., ENB) |

One preferred class of porogens is the polyfunctional cyclic non-aromatic compounds, particularly alpha-terpienes (ATRP). Suitable alpha-terpiene derivatives include, for example, alpha-terpiene itself, substituted alpha-terpienes, and multi-ring compounds containing the alpha-terpiene nucleus. Other compounds include functional groups such as —CH=CH$_2$, —CH=CH—, —C≡CH, —C≡C—, —C=O, —OCH$_3$. A typical example of these compounds is 1,2,3,4-tetramethyl-1,3-cyclopentadiene (TMCP) (C$_9$H$_{14}$). Three-dimensional multi-ring compounds such as 5-ethylidene-2-norbornene (ENB) are also suitable.

In some cases, the porogen and structure former reside in the same compound. That is, the porogen is a removable moiety in a compound that contains moieties serving as structure formers covalently bonded to moieties serving as the porogen. Nominally, the porogen moiety is a large bulky organic substituent that will leave pores in the resulting dielectric film. Examples of such species are organic silanes such as di-tert-butylsilane, phenyldimethylsilane, and alkoxysilanes such as 5-(bicycloheptenyl)methyldimethoxysilane (BMDS) and 5-(bicycloheptenyl)triethoxysilane (BTS) (SiC$_{13}$O$_3$H$_{24}$). These compounds may be deposited using CVD or spin on methods, for example. As indicated, the structure former serves as a backbone for the resulting porous low-k film.

Many different chemical compositions may be used as the structure former. In some embodiments, the composition includes silicon and oxygen. Sometimes it also includes carbon (carbon-doped oxide, CDO) and/or other elements and even metals. For relatively thick precursor layers, it will sometimes be desirable to use structure formers that are not opaque to the UV radiation.

Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)).

Note that one example of a silane is di-tert-butylsilane, described above. The thickness of the precursor film (and hence the resulting dielectric layer) depends upon the ultimate application. As an example, the thickness may range between about 50 to 1500 angstroms for a hard mask application. For an interlayer dielectric or packaging application, the thickness may range from 1500 angstroms up to about 2 to 3 microns. In some cases, extra thickness is required to provide some amount of sacrificial dielectric to accommodate a subsequent planarization or polishing step. In some cases, the thickness of the precursor layer may be driven in part by the ability of the UV radiation to penetrate the film and remove the porogen. In these cases, the sequence of precursor film deposition followed by UV exposure may be repeated several times to achieve the desired final thickness.

It will be appreciated by those skilled in the art that the UV radiation used with the invention encompasses near-UV, as well as UV wavelengths. Methods of the invention utilize UV radiation for various operations including facilitating porogen removal, reconstructing chemical bonds to mechanically strengthen the dielectric film, and facilitating cleaning of the reaction chamber. Some operations may more effectively be implemented using UV light with a particular range of wavelengths, i.e., wavelength distribution. For instance, a wavelength distribution appropriate for interacting with a porogen for porogen removal from a precursor film may differ from the wavelength distribution appropriate for interacting with oxygen gas molecules to create ozone and oxygen radicals to clean the walls of a reaction chamber. In addition, some operations may more effectively be implemented using UV light having at least a predefined intensity, sometimes referred to as a threshold intensity. The threshold intensity for any particular film can vary depending upon numerous factors such as UV exposure time, film type and process conditions. For purposes of the invention, light intensity is measured in terms of power density (in $mW/cm^2$). Details as to how power density is measured will be described later. For chamber cleaning, any precursor that can be dissociated by UV light and can attack any residual deposition from UV process may be used.

Process Flow

FIG. 1 is a flow chart depicting one general high-level process flow in accordance with some embodiments of the present invention. Initially, a precursor film is provided on a substrate as indicated by a process block 101. As mentioned previously, a precursor film contains a porogen and a structure former for the dielectric backbone. In many embodiments of commercial application, the substrate is a partially fabricated integrated circuit or other partially electronic semiconductor device.

As described above, various techniques for forming a precursor film may be employed. A typical approach involves co-depositing the porogen with the structure former precursor using a low temperature PECVD (plasma enhanced chemical vapor deposition) process. As indicated, other processes such as high temperature chemical vapor deposition methods and spin-on methods may be employed. Other suitable deposition techniques may include supercritical infusion, print-on, and dip coating. It is noted again that the invention is not limited to any particular type of deposition method.

Next, the precursor film is processed to remove porogen. In the embodiment depicted in FIG. 1, the film is exposed to UV radiation to mediate removal of at least a portion of the porogen to leave a porous dielectric film. See optional process block 103. As indicated, the UV light can directly interact with porogen bonds and thereby facilitate its decomposition or other breakdown mechanism. In a typical case, the porogen decomposes into lower molecular weight components that exist in the vapor phase or can be easily vaporized and thereby removed from the precursor film. Alternatively the UV radiation can indirectly facilitate breakdown of the porogen. In one example, this is accomplished by the UV radiation interacting with a compound other than the porogen to convert that compound into a species that can attack the porogen and thereby facilitate its removal. For example, the UV radiation may convert molecular oxygen or other oxygen containing compounds present in a reaction chamber to produce a strong oxidant, which can then react with and break down the porogen. Again, the decomposition products of the porogen can be volatilized and removed from the precursor film.

As indicated, the UV wavelength(s) should match the absorption characteristics of the porogen bonds to be broken and/or the oxidizing agent, if used. In cases where UV light directly interacts with and removes porogen, the typical wavelengths suitable for most types of porogens range between about 156 and 800 nanometers. Common bonds to be targeted which contribute to the overall absorption characteristics of the porogen-containing film are Si—O, Si—$CH_3$, C—C, C=C and C—H. For example, ATRP has an absorption peak at approximately 250 nanometers; therefore, a UV source intended to interact directly with a film containing ATRP preferably has high intensity components in the range of about 220 to 285 nanometers. Note that the radiation may comprise a narrow range of wavelengths (e.g., most intensity exits in a band of about 1 to 20 nanometers) or a broader range of wavelengths.

Preferred wavelengths and light intensities for porogen removal will vary depending upon factors such as porogen type and film density and thickness, as well as other parameters such as wafer temperature, exposure time, and process chamber pressure. For most organic porogens, preferred wavelength distributions range between about 156 nm and 800. UV exposure time is largely a function of the wavelength distribution and light intensities, as well as film density and thickness. Typical UV exposure times may range from second to tens of hours. Preferably, for commercial applications, the exposure time will be about 5 minutes or less. In a preferred embodiment, the exposure time ranges from about 1 second up to 60 minutes. Substrate temperature during ultraviolet radiation exposure typically ranges between about −10 and 600 degrees Celsius, preferably below 400 degrees Celsius.

Note that the operations 101 and 103 can be conducted in a single vessel or in two separate vessels, one for forming the precursor layer and another for exposing the porogen to UV radiation or a UV activated species. Also, it is possible for a wafer to be treated in this manner in one chamber and then moved to a different chamber where the decomposed porogen is removed by heating, contact with a solvent, etc. In general, however, for mechanical simplicity, it is preferred to perform as many operations as possible in a single chamber.

Note that the invention is not limited to UV mediated porogen removal. Other techniques such as thermal decomposition or volatilization, plasma decomposition, supercritical extraction and/or reaction with a supercritical medium may also be employed.

Returning to FIG. 1, after the porogen is removed, the porous dielectric film is further exposed to UV radiation to mechanically strengthen the film. See block 105. Typical wavelengths range between about 156 nm to about 800 nm with typical light intensity ranging between about 1 $\mu W/cm^2$ and 3000 $mW/cm^2$. UV exposure times can vary broadly with typical exposure times ranging between about 1 second and 60 minutes. In preferred embodiments, the process of 105 occurs in an inert environment. Such environments may include an inert gas such as nitrogen, helium or argon in the reaction chamber. In some embodiments of the invention, a more reactive ambient comprising hydrogen, oxygen carbon dioxide or a combination thereof may be used during UV exposure. A combination of the reactive and inert gases mentioned above may also be used. The pressure during UV exposure is typically between 1 $\mu$Torr and 760 Torr. It is believed that the UV light causes partial reconstruction of chemical bonds within the film in a manner that strengthens the dielectric network. To a certain extent, however, excess UV light exposure has been found to also increase the dielectric constant (k) of the film. UV exposure time and UV intensity are used to optimize film hardness for a desired dielectric constant.

Figure 2A:
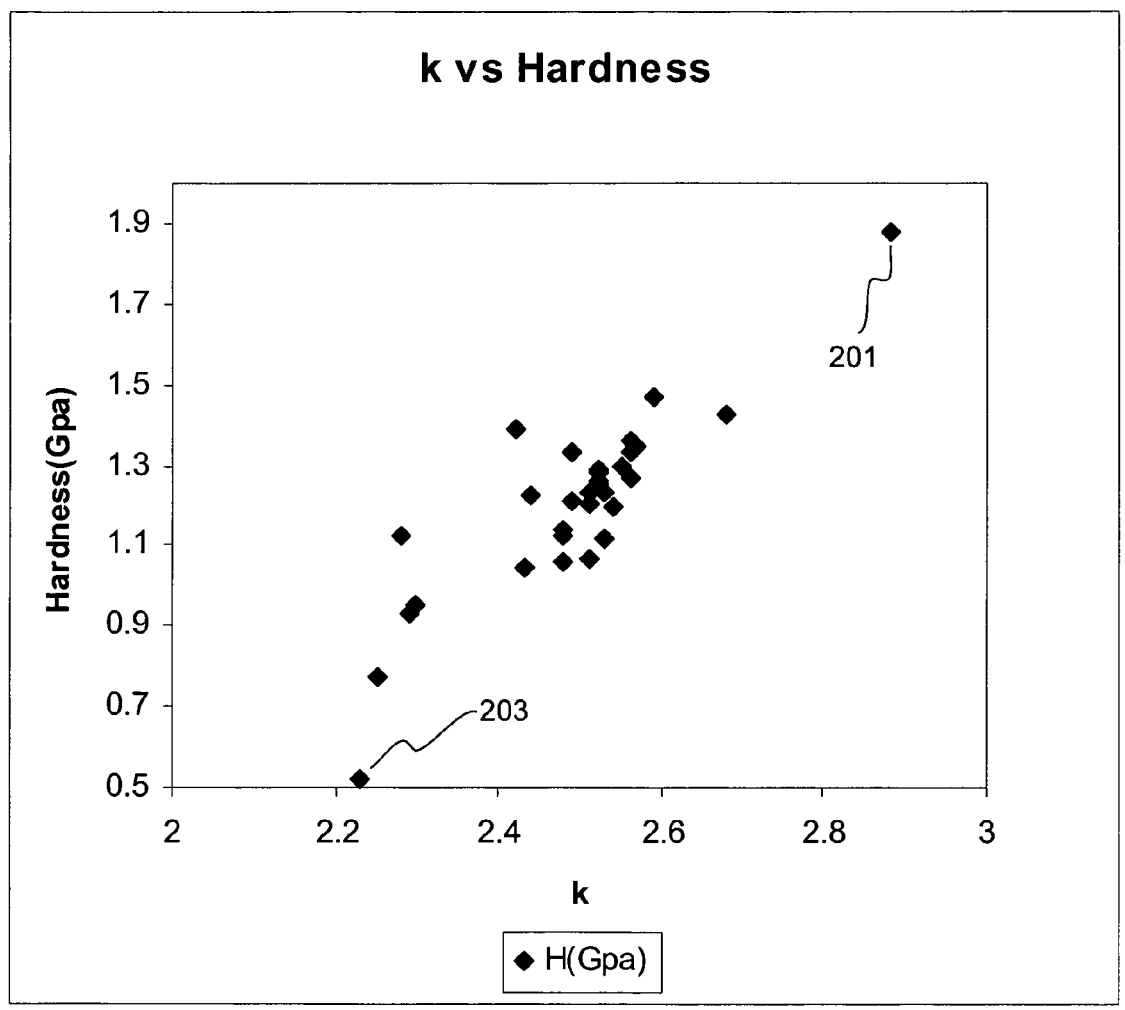
FIG. 2A is a graph representing film hardness as a function of dielectric constant (k) showing the range of dielectric film hardness values and dielectric constants that can be formed using UV exposure.

FIG. 2A shows data illustrating the variation in hardness as a function of dielectric constant.

FIG. 2A is a graph showing hardness as a function of dielectric constant (k) for a number of post-porogen removal porous films exposed to various amounts of UV radiation. Hardness was measured in Giga Pascal (GPa) by way of nanoindentation. As shown, films that are harder also tend to have higher k values. For example, film sample 201 has a hardness value of about 1.9 GPa and a k value of about 2.9 while film sample 203 has a hardness value of about 0.5 GPa and a k value a bit above 2.2. To account for the k-hardness relationship, one can start with a dielectric material having a value of k that is lower than required for the ultimate application. Then upon exposure to UV radiation, the hardness of the dielectric material increases significantly up to the point where k reaches the maximum acceptable value. For many applications, acceptable k values range between about 2 and 2.9 (more preferably between about 2.2 and 2.7) and acceptable film hardness levels range between about 0.5 GPa and 3 GPa (and more preferably greater than 0.8 GPa).

Note that UV treatments in accordance with this invention may sometimes improve other mechanical properties besides just hardness. For example, they may increase cohesive strength of the dielectric film. Preferably, the cohesive strength, as measured by cracking threshold, is at least about 2 micrometers.

Suitable UV sources (as characterized by wavelength distributions and light intensities) can be chosen based upon a number of factors including the dielectric film thickness and composition as well as the desired hardness and dielectric constant of the resultant film. To some extent the exposure time is a strong function of the UV intensity. But below a certain threshold intensity, desired hardening may not occur even after prolonged exposure. For a typical CDO film of with a thickness ranging between about 1500 and 10000 Angstroms, for example, preferable exposure times typically range between about 1 second and 60 minutes. Note that for commercial applications the exposure time will preferably be about 5 minutes or less.

Figure 2B:
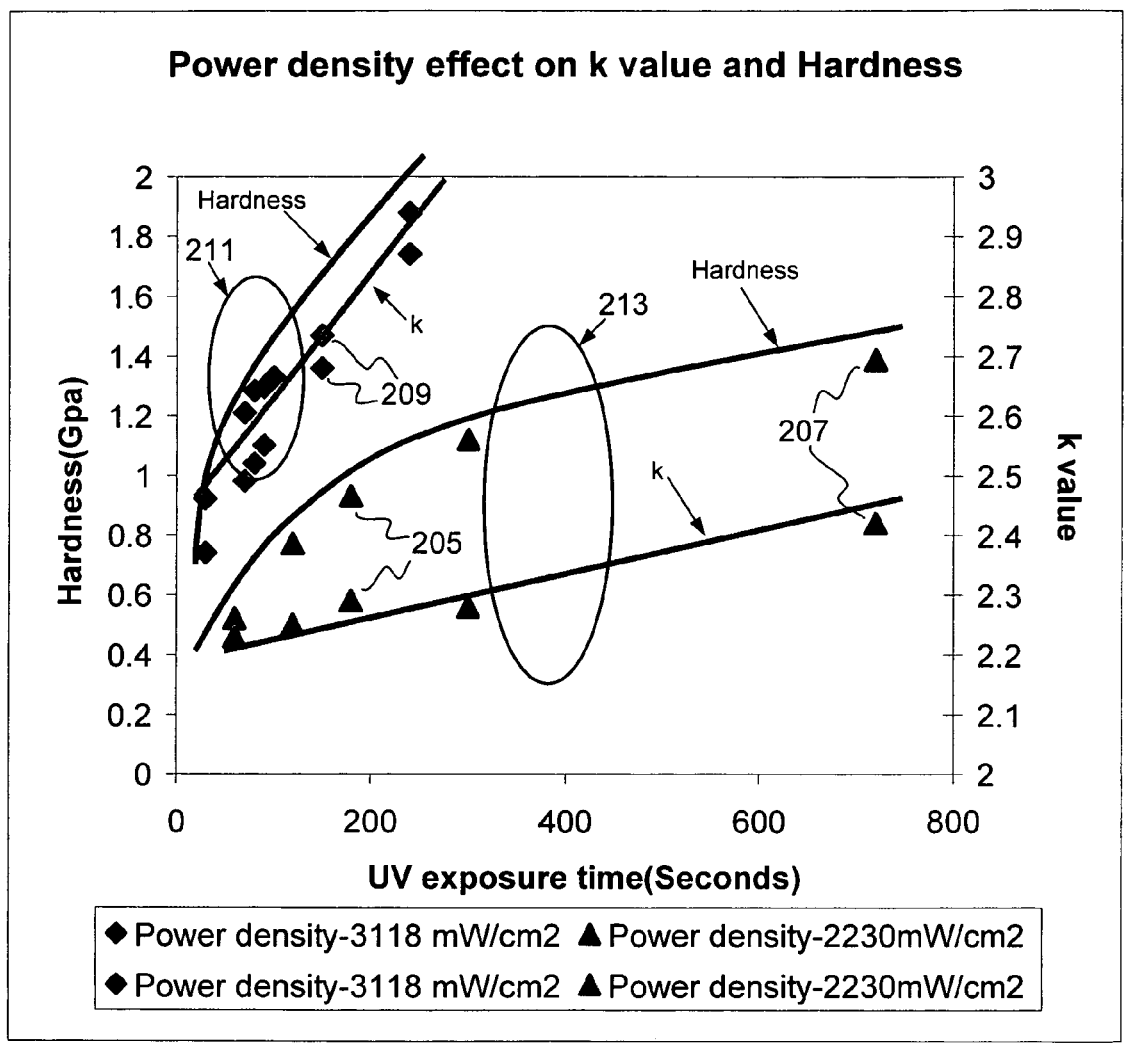
FIG. 2B is a graph representing film hardness and dielectric constant as a function of UV exposure time and power density.

FIG. 2B is a graph showing hardness and k-values as functions of UV exposure time and power densities (light intensities). Wafer samples were exposed to two different power densities (light intensities): 2230 $mW/cm^2$ (each wafer sample denoted with a triangle symbol) and 3118 $mW/cm^2$ (each wafer sample denoted with a diamond symbol). The hardness values are denoted by the dark colored symbols and the k-values are denoted by the light colored symbols. For example, wafer sample 205 was exposed to UV radiation with power density of 2230 $mW/cm^2$ for about 190 seconds, resulting in a film with a hardness value of almost 1 GPa and a k-value of about 2.3. Best-fit curves for hardness and k-values at each power density are also shown.

Each of the wafer samples had porous CDO film deposited thereon. A broadband light source (mercury vapor lamp) was used and supplied high intensity UV radiation ranging in wavelength between about 156 nm and 800 nm. Power density was determined by use of a radiometer positioned in the apparatus and which directly measures the amount of incident UV radiation. In this case the power density (light intensity) incident upon the wafer was modulated by adjusting the distance between the wafer substrate and the UV source.

As shown by FIG. 2B, increasing UV exposure time increased film hardnesses and k-values using both UV power densities (2230 $mW/cm^2$ and 3118 $mW/cm^2$). As illustrated by the best-fit curves, in general, hardness values and k-values increased more quickly with increased exposure time using the higher power density light. Thus, those samples exposed to the lower power densities will require longer exposure times than those samples exposed to the higher power densities to achieve the desired hardness. For example, wafer sample 207, which is exposed to the lower power density (2230 $mW/cm^2$), was exposed for about 700 seconds to achieve a hardness value of about 1.4 GPa, while wafer sample 209, which is exposed to the higher power density (3118 $mW/cm^2$), was only exposed for about 200 seconds to achieve about the same hardness value (about 1.4 GPa). Note although the hardness values for wafer samples 207 and 209 are about equivalent, the k-values differ somewhat (k for 207 is about 2.4, k for 209 is about 2.7). Note that for many ultra low-k dielectric applications, an acceptable hardness value is about 1.2 GPa or above. Thus, for those samples exposed to 3118 $mW/cm^2$, exposure times of about 150 seconds (indicated by 211 area) and above and for those samples exposed to 2230 $mW/cm^2$, exposure times of about 400 seconds (indicated by 213 area) and above are preferred. Of course, for any particular application, the exposure times and UV power densities will vary depending upon a multitude of factors including film type, film thickness, application type, desired film properties, apparatus configuration and other factors.

The wafer substrate temperature may influence the hardening process. In some embodiments, higher temperatures may be more effective, but the temperature should not be too high as to cause damage to the substrate device. In general, temperatures below about 450 degrees C. are preferable, more preferably $\leq$400 degrees C., as higher temperatures can damage a partially fabricated device, particularly one that employs copper lines. Typical temperatures range between about −10 up to 450 degrees C. It should be noted that exposure to UV radiation can itself contribute to substrate heating.

Note that the operations 103 and 105 can be conducted in a single vessel or in two separate vessels, one for UV exposure for removing porogen and another for UV exposure for mechanical hardening. In preferred embodiments, the two operations are performed in the same reaction chamber. An example of a suitable apparatus for accomplishing this will be described later. If the operations are performed in the same reaction chamber, it is possible to overlap some portions of the operation. For example, a light source that can provide UV radiation that can adequately remove porogen as well as sufficiently mechanically strengthen the film may be used for both processes.

Referring back to FIG. 1, as indicated by decision 107, for thicker dielectric film applications, operations 101, 103 and 105 may be repeated performed until the desired film thickness is achieved. Once the porous dielectric is sufficiently strengthened and is of sufficient thickness, the wafer is removed from the reaction chamber (block 109). Next, the reaction chamber may optionally be cleaned by exposing a reactive gas to another dose of UV radiation (block 111). This cleaning procedure is for removing porogen residues that may have coated the inside of the chamber after the porogen removal process (block 103). Porogen residues can be particularly problematic if it coats the window through which the UV radiation passes. If this window becomes coated, less radiation will reach the substrate and subsequent wafer processing can yield inconsistent results.

To clean the chamber, first the wafer is removed from the chamber to prevent wafer contamination. In preferred embodiments, the chamber is then evacuated to remove air. Next, a gas is introduced into the chamber. The gas is preferably an oxygen-containing gas, more preferably oxygen. However, other appropriate gases such as fluorine-containing gases can be used. In some embodiments, the reaction chamber will be maintained at a pressure suitable for most effective cleaning by using a vacuum pump to evacuate the chamber in combination with the addition of gases. Next, the gas is activated by exposure to UV radiation to produce reactive species that can clean the surfaces inside the chamber. If oxygen is used, for example, reactive species can include ozone and oxygen radicals. The UV radiation wavelength and intensity should be chosen to sufficiently activate the gas and create a sufficient amount of reactive species. For oxygen, preferred wavelengths range between about 150 nm and 250 nm. The intensity of the UV light preferably ranges between about 1 $\mu W/cm^2$ and 3000 $mW/cm^2$. In some embodiments, the chamber is then evacuated to remove the volatilized porogen residues from the chamber.

After operation 111, the process flow of FIG. 1 is complete.

Apparatus

The present invention can be implemented in many different types of apparatus. In preferred embodiments, the apparatus will include one or more chambers (sometimes referred to as process vessels) that house one or more wafers and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during procedures of the invention. For certain operations in which the wafer temperature is to be controlled, the apparatus may include a heating or cooling platen.

Figure 3:
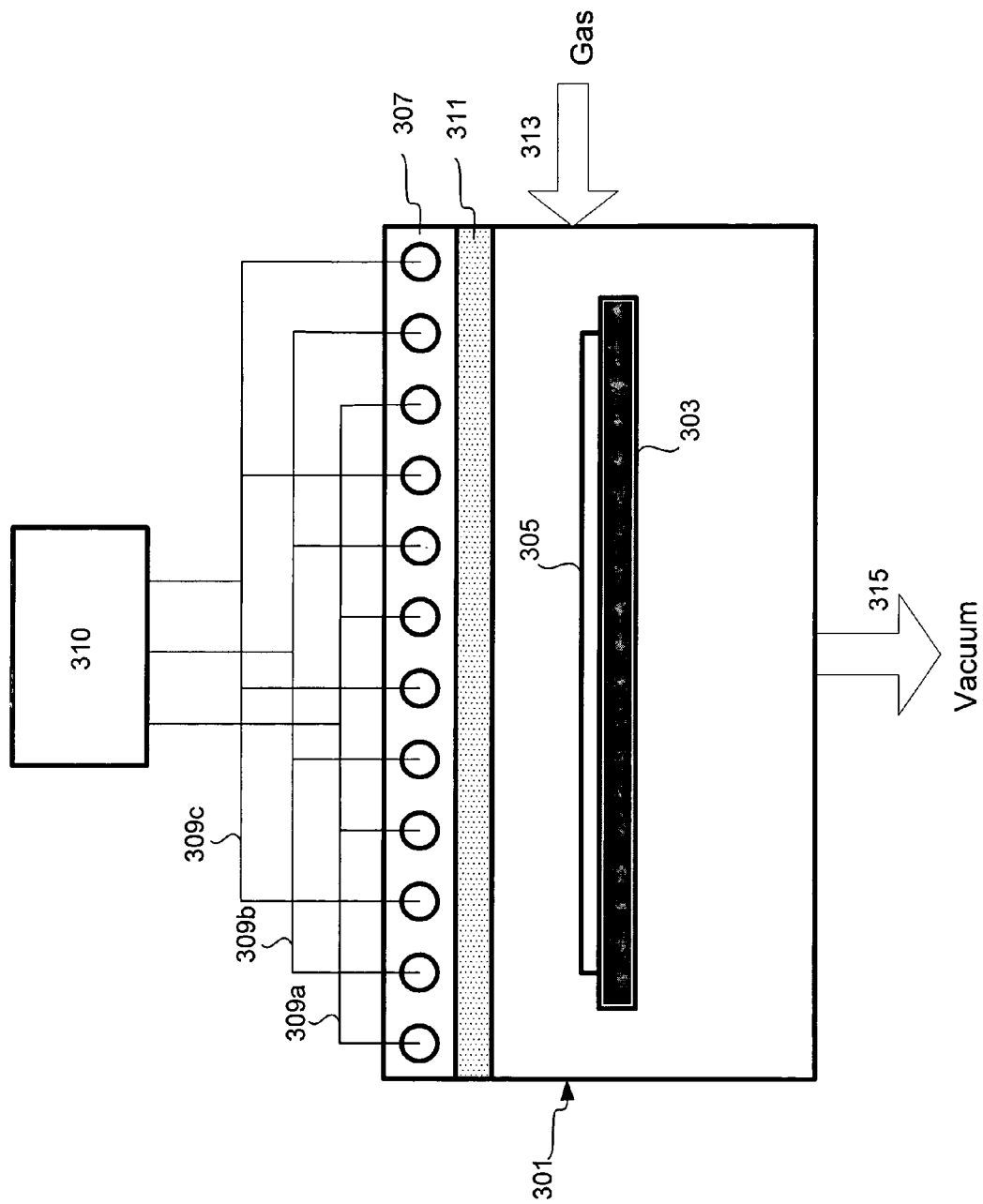
FIG. 3 is a schematic representation of an apparatus suitable for UV porogen removal, UV mechanical strengthening and UV activated chamber cleaning in accordance with some embodiments of this invention.

FIG. 3 is a schematic diagram of an example chamber 301 in accordance with the invention. Chamber 301 is capable of holding a vacuum and/or containing gases at pressures above atmospheric pressure. For simplicity, only one chamber 301 is shown. It is noted that in preferred embodiments, chamber 301 is one chamber in a multi-chambered apparatus (entire apparatus not shown), although chamber 301 could alternatively be part of a stand-alone single chambered apparatus. Suitable multi-chambered apparatus, for example, include the modified Novellus Sequel and Vector systems.

A substrate holder 303 secures a wafer 305 in a position such that light from a UV light source array 307 can irradiate wafer 305. Substrate holder 303 can have a heater (not shown) that can heat the substrate to defined temperatures, or could be cooled using a chiller and can be controlled by a temperature controller (not shown). Chamber 301 is configured with a gas inlet 315, which is connected to a gas source (not shown), and with a vacuum outlet 313, which is connected to a vacuum pump (not shown). The amount of gas introduced into chamber 301 can be controlled by valves and mass flow controller (not shown) and pressure is measured by pressure gauge (not shown).

In this example, UV light source array 307 is mounted outside the chamber 301. In alternate embodiments, the UV light source array may be housed inside chamber 301. UV light source array 307 includes an array of individual UV sources such as mercury vapor or xenon lamps. Note that the invention is not limited to mercury vapor or xenon lamps as UV light sources and other suitable light sources include deuterium lamps or lasers (e.g., Excimer lasers and tunable variations of various lasers). Various optical elements, such as reflectors, may be required to direct the UV light toward portions of the substrate. Methods for directing the light at different portions of the substrate at different times may be required as well. A scanning mechanism may be used for this purpose. A window 311 made of quartz, sapphire or other suitable material is positioned between UV light source array 307 and wafer 305 to provide vacuum isolation. Filters can also be used to remove unwanted spectral components from particular sources to "tune" the sources for particular applications (e.g., porogen removal, dielectric hardening, or chamber cleaning).

In this particular embodiment, a UV light source array 307 is comprised of an array of three types of UV sources, each type providing UV radiation with a different wavelength distribution chosen for different operations of the invention. The three types of sources are arranged alternately in the array 307 to maximize uniformity of each type of wavelength distribution reaching wafer 305 for each operation of the invention. Each of the same type of UV source is electrically connected to each other (309a, 309b and 309c) and controlled by control system 310, which controls when each of the various UV sources of each type is illuminated. Control system 310 is typically, but not limited to, a computer processing system such as a PC or workstation. For example, at time 1, UV sources 309a are turned on and irradiate on wafer 305 to remove porogen. At time 2, UV sources 309a are turned off. At time 3, UV sources 309b are turned on and irradiate wafer 305 to mechanically strengthen the dielectric film. At time 4, UV sources 309b are turned off. After removal of wafers, at time 5, UV sources 309c are turned on to activate oxygen to produce ozone and oxygen radicals. At time 6, UV sources 309c are turned off. Note that in some methods it may be preferable to have all or some of UV sources 309a, 309b and 309c turned on simultaneously during all operations or portions of operations. Control system 310 will preferably be configured to accommodate any of these embodiments.

Figure 4:
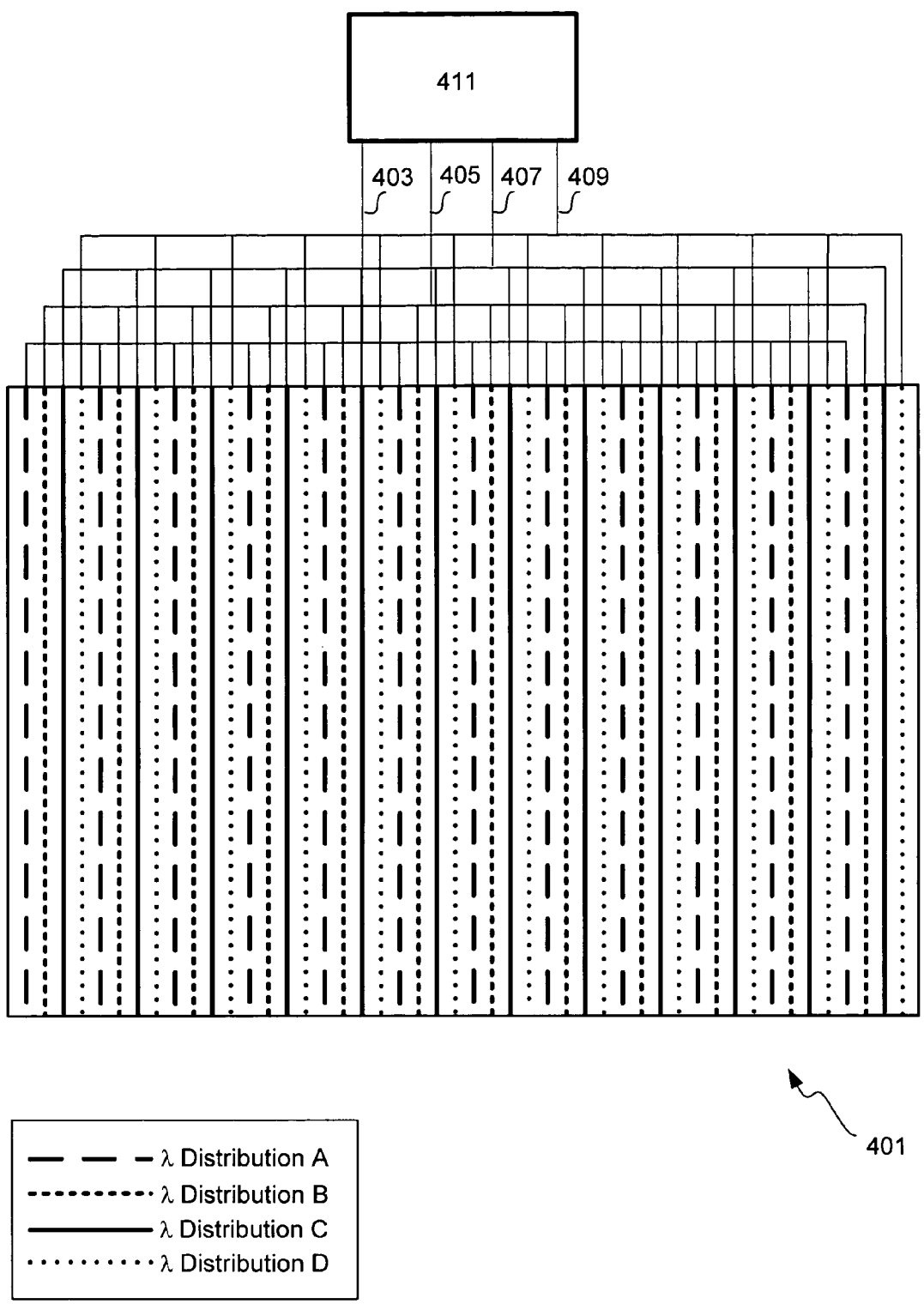
FIG. 4 is a schematic representation (top view) of a UV light source array that may be used as part of an apparatus in accordance with some embodiments of the invention.

Of course, any number and types of individual light sources in any suitable configuration can be used. For example, FIG. 4 is a schematic representation of a UV lamp array 401 (top view) with four different source types (represented with solid and dashed lines) alternately arranged side-by-side in the UV source array 401 to provide uniform radiation of each wavelength distribution to the wafer. Each type of source (e.g., lamp) has a different wavelength distribution A, B, C or D. Each of the same type of UV source is electrically connected to each other (403, 405, 407 or 409) and controlled by control system 411, which controls when each of the various UV sources of each type are illuminated. For example, when all of sources 403 are turned on, UV light with wavelength distribution A will uniformly irradiate the wafer. Likewise, when all of sources 405 are turned on, UV light with wavelength distribution B will uniformly irradiate the wafer. The four different sources may be appropriate when, for example, film hardening and porogen removal are optimized at two distinct spectral ranges.

Note that the light source array configurations of FIG. 3 or 4 are only examples of suitable configurations. In general, it is preferable that the lamps are arranged to provide uniform UV radiation to the wafer. For example, other suitable lamp arrangements can include circular lamps concentrically arranged or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

In addition, the control system and electronic connection configurations are not limited to those shown in FIGS. 3 and 4. For example, other suitable embodiments include those wherein one or more of the UV sources electrically connected to UV sources of different types. That is, more than one type of UV source may be electrically connected to each other and turned on at a particular time.

As mentioned previously, some operations involve using UV light with a particular wavelength distribution and of at least a certain light intensity (threshold intensity). The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. As with the direction of light, the intensity of light at the wafer can be modulated using various optical components such as mirrors, lenses, diffusers and filters. The spectral distribution of individual sources can be controlled by the choice of sources (e.g., mercury vapor lamp vs xenon lamp vs. deuterium lamp vs. Excimer laser, etc.) as well as the use of filters that tailor the spectral distribution. In addition, the spectral distributions of some lamps can be tuned by doping the gas mixture in the lamp with particular dopants such as iron, gallium, etc Referring back to FIG. 3, during normal operation, chamber 301 is first evacuated via vacuum outlet 313, and then the inert gas (e.g., argon, nitrogen) is introduced via gas inlet 313 to a certain chamber pressure or the chamber is left under vacuum. Next, all UV sources controlled by control system 309a are turned on to provide uniform UV radiation of an appropriate wavelength distribution to remove porogen material and leave a dielectric layer on wafer 305. Chamber 301 is typically under vacuum to remove volatilized porogen residues or under continuous purge to remove any of the porogen evolving during UV exposure. Inert gas is again introduced via gas inlet 313 or the chamber is left under vacuum. Next, all UV sources controlled by control system 309b are turned on to provide uniform UV radiation of an appropriate wavelength distribution to mechanically strengthen the dielectric layer on wafer 305. Typically, wafer 305 is then removed from chamber 301. Next, oxygen is introduced via gas inlet 313 into chamber 301 and all UV sources controlled by control system 309c are turned on to provide uniform UV radiation of an appropriate wavelength distribution to clean the inside of chamber 301, including quartz window 311. Processes involving mixtures of inert gas and oxygen may also be utilized. Note that during a typical operation, one set of one type of UV source is turned on at a time to perform each operation. In some embodiments, however, some portions of the UV exposure operations may overlap.

Note that the apparatus depicted in FIG. 3 is only an example of a suitable apparatus and other designs for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include an array of UV radiation sources. Many of these systems may also be used to perform the post-porogen removal UV mechanical strengthening, silanol capping and/or post-porogen removal chamber cleaning procedures. Obviously, in these cases, the chamber system will likely be pumped out between each of the process steps.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of preparing a porous low-k dielectric layer on a substrate, the method comprising:
   (a) forming a precursor film on the substrate, the precursor film comprising a porogen and a structure former;
   (b) removing the porogen from the precursor film to thereby create voids within the dielectric material and form the porous low-k dielectric layer; and
   (c) exposing the dielectric material to ultraviolet radiation in a manner that increases the mechanical strength of the porous low-k dielectric layer; wherein the ultraviolet radiation in (c) has an intensity of between about 2230 W/cm$^2$ and 3118 W/cm$^2$ and (c) occurs for a time period time period between about 1 and 200 seconds.

2. The method of claim 1, wherein the substrate is a semiconductor wafer.

3. The method of claim 2, wherein the porous low-k dielectric layer is formed on the semiconductor wafer using a single-wafer or batch process.

4. The method of claim 1, wherein the precursor film comprises a porogen and a silicon-containing structure former.

5. The method of claim 1, wherein the precursor film is formed by co-depositing the porogen with the structure former.

6. The method of claim 1, wherein the structure former is produced from at least one of a silane, an alkylsilane, an alkoxysilane, siloxane, carbon-doped variation thereof, or combination thereof.

7. The method of claim 1, wherein the structure former is produced from diethoxymethylsilane (DEMS), octamethylcyclotetrasiloxane (OMCTS), tetramethylcyclotetrasiloxane (TMCTS), dimethyldimethoxysilane (DMDMOS), carbon-doped oxides or a combination thereof.

8. The method of claim 1, wherein the porogen comprises a polyfunctional cyclic non-aromatic compound.

9. The method of claim 8, wherein the polyfunctional cyclic non-aromatic compound is an alpha-terpiene (ATRP) compound.

10. The method of claim 9, wherein the porogen comprises a mesoporous structure formed from a block copolymer.

11. The method of claim 1, wherein the precursor film is formed by a chemical vapor deposition process, plasma-enhanced CVD (PECVD) or a spin-on technique.

12. The method of claim 1, wherein (b) involves exposing the porogen within the precursor film to ultraviolet radiation.

13. The method of claim 12, wherein the ultraviolet radiation comprises a wavelength at or near an absorption peak of the porogen.

14. The method of claim 12, wherein the ultraviolet radiation comprises a wavelength distribution ranging from about 156 nm to about 800 nm.

15. The method of claim 12, wherein exposure to ultraviolet radiation occurs for a time period ranging between about 1 second and about 60 minutes.

16. The method of claim 12, wherein the substrate temperature during ultraviolet radiation exposure ranges between about minus 10 and about 600 degrees Celsius, preferably below 400 degrees Celsius.

17. The method of claim 1, wherein at least part of (b) and (e) occur simultaneously.

18. The method of claim 1, wherein (c) is performed under an ambient comprising at least one of argon, nitrogen, helium, hydrogen, oxygen, carbon dioxide, and a combination thereof.

19. The method of claim 1, wherein (c) is performed under vacuum.

20. The method of claim 1, wherein (c) involves using ultraviolet radiation comprising a wavelength distribution ranging from about 156 to about 800 nm.

21. The method of claim 1, wherein (c) involves using a substrate temperature ranging between about minus 10 and about 450 degrees Celsius.

22. The method of claim 1, wherein (c) is performed at pressures ranging between about 1 µTorr and about 760 Torr (atmospheric pressure).

23. The method of claim 1, wherein after (c), the porous low-k dielectric layer has a hardness value ranging between about 0.5 GPa and about 3 GPa.

24. The method of claim 1, wherein (a), (b) and (c) are repeated to form a film with desired properties.

25. The method of claim 1, further comprising providing a reactive gas that cleans porogen residue from an apparatus in which the porogen is removed from the precursor film.

26. The method of claim 25, wherein providing a reactive gas that cleans porogen residue from an apparatus comprises introducing a gas into the apparatus and exposing the gas to ultraviolet radiation having a wavelength that activates the gas.

27. The method of claim 26, wherein the gas is oxygen.

28. A method of preparing a porous low-k dielectric layer on a substrate, the method comprising:
(a) providing in a reaction chamber a substrate having a precursor film comprising a porogen and a structure former;
(b) exposing the porogen from the precursor film to ultraviolet radiation of a first wavelength distribution to thereby create voids within the dielectric material and form the porous low-k dielectric layer;
(c) exposing the dielectric material to ultraviolet radiation of a second wavelength distribution to increase the mechanical strength of the porous low-k dielectric layer; and
(d) activating a gas by exposure to ultraviolet radiation of a third wavelength distribution to produce a species that cleans porogen residue from surfaces within the reaction chamber.

29. The method of claim 28, wherein the ultraviolet radiation of a first wavelength distribution includes radiation at a wavelength at or near an absorption peak of the porogen.

30. The hod of claim 28, wherein the ultraviolet radiation of a second wavelength distribution includes radiation with a wavelengths ranging from about 156 to about 800 nm.

31. The method of claim 28, wherein first, second and third wavelength distributions are produced by first, second, and third ultraviolet sources, respectively.

32. The method of claim 28, wherein the gas in (d) oxygen.

33. The method of claim 28, wherein activating the oxygen in (d) produces at least one of ozone and active oxygen radicals.

34. The method of claim 28, wherein the ultraviolet radiation of a third wavelength distribution includes radiation with a wavelengths ranging from about 150 to about 250 mm.

35. The method of claim 28, wherein the ultraviolet radiation of a third wavelength distribution includes radiation with an intensity ranging between about 1 $\mu W/cm^2$ and about 3000 $mW/cm^2$.

36. The method of claim 28, wherein (d) occurs for a time period ranging between about 1 second and about 60 minutes.

37. The method of claim 28, wherein the gas in (d) comprises at least one of a fluorine-containing gas or an oxygen-containing gas.

38. The method of claim 28, further comprising evacuating the reaction chamber to remove volatilized porogen residue during (d).

* * * * *

UNITED STATES PATENT AND TRADEMARK OFFICE
CERTIFICATE OF CORRECTION

PATENT NO. : 7,265,061 B1 Page 1 of 1
APPLICATION NO. : 10/800377
DATED : September 4, 2007
INVENTOR(S) : Cho et al.

It is certified that error appears in the above-identified patent and that said Letters Patent is hereby corrected as shown below:

In the Title Page;

Add the following:

Related U.S. Application Data

(60)   Provisional application No. 60/469,433, filed on May 9, 2003

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,265,061 B1 | Page 1 of 1 |
| APPLICATION NO. | : 10/800377 | |
| DATED | : September 4, 2007 | |
| INVENTOR(S) | : Cho et al. | |

It is certified that error appears in the above-identified patent and that said Letters Patent is hereby corrected as shown below:

In the Claims:

Column 14, line 61, change "2230 W/cm$^2$" to --2230 mW/cm$^2$--

Column 14, line 61, change "3118 W/cm$^2$" to --3118 mW/cm$^2$--

Signed and Sealed this

Second Day of December, 2008

JON W. DUDAS
*Director of the United States Patent and Trademark Office*